(12) United States Patent
Naem (10) Patent No.: US 7,847,385 B1
(45) Date of Patent: Dec. 7, 2010

(54) STACKED DIE STRUCTURE WITH AN UNDERLYING COPPER-TOPPED DIE

(75) Inventor: Abdalla Aly Naem, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 251 days.

(21) Appl. No.: 11/895,334

(22) Filed: Aug. 24, 2007

(51) Int. Cl.
*H01L 23/02* (2006.01)

(52) U.S. Cl. .................. 257/686; 257/E23.027

(58) Field of Classification Search ............ 257/686, 257/E23.027

See application file for complete search history.

(56) References Cited

U.S. PATENT DOCUMENTS

2007/0057357 A1* 3/2007 Chen ................ 257/686
2008/0136005 A1* 6/2008 Lee et al. ................ 257/686

* cited by examiner

*Primary Examiner*—Evan Pert
*Assistant Examiner*—Krista Soderholm
(74) *Attorney, Agent, or Firm*—Mark C. Pickering (57) ABSTRACT

A copper-topped die, which has exposed copper lines and pads, is utilized as the lower die in a stacked die structure. A non-conductive material is formed over the lower copper-topped die, and then selectively removed so that the non-conductive material covers and lies between the copper lines while none of the non-conductive material lies over the copper pads. An upper die is then attached to the non-conductive material.

19 Claims, 9 Drawing Sheets

STACKED DIE STRUCTURE WITH AN UNDERLYING COPPER-TOPPED DIE

BACKGROUND OF THE INVENTION

1. Field of the Invention

The present invention relates to a stacked die structure and, more particularly, to a stacked die structure with an underlying copper-topped die, and a method of forming the stacked die structure.

2. Description of the Related Art

A copper-topped die is an integrated circuit chip that utilizes copper traces in lieu of aluminum traces to form the top layer of the metal interconnect structure. By using copper traces in place of aluminum traces, the resistance of the top layer of the metal interconnect structure can be substantially reduced.

Figure 1A:
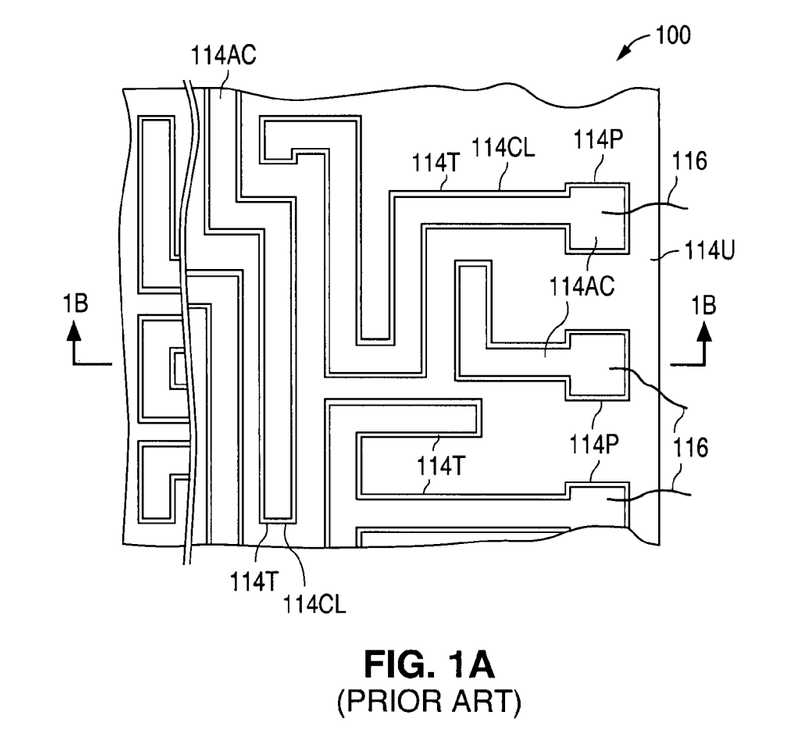
Figure 1B:
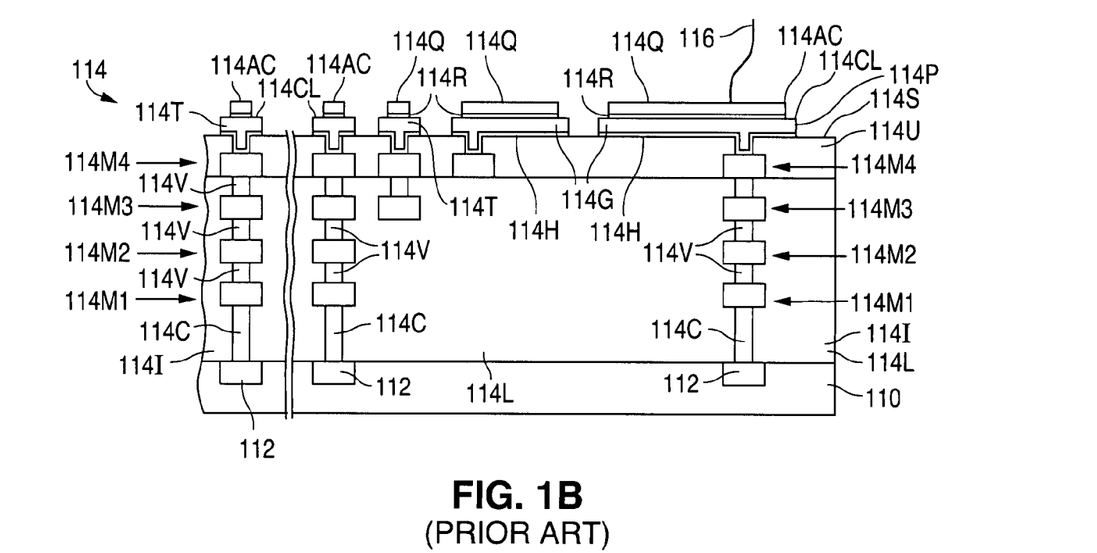
FIG. 1B is a cross-sectional view taken along line 1B-1B of FIG. 1A.

FIGS. 1A-1B show views that illustrate a prior-art copper-topped die 100. FIG. 1A shows a plan view, while FIG. 1B shows a cross-sectional view taken along line 1B-1B of FIG. 1A. As shown in FIGS. 1A-1B, copper-topped die 100 includes a substrate material 110, and a number of semiconductor devices that are formed in and on substrate material 110.

The semiconductor devices, which include resistors, transistors, capacitors, diodes, and similar devices, have a number of conductive contact regions 112, such as the ends of a resistor and the terminals of a transistor, that are formed in substrate material 110. Each conductive contact region 112 has a dopant concentration that is greater than the dopant concentration of substrate material 110.

Copper-topped die 100 also includes a multi-layered metal interconnect structure 114 that touches semiconductor material 110 and the semiconductor devices (e.g., the conductive contact regions 112) to electrically connect the semiconductor devices together to realize an electrical circuit.

Metal interconnect structure 114 includes a number of contacts 114C that touch the conductive contact regions 112 (either directly or via silicide). Metal interconnect structure 114 also includes a number of metal-1 traces 114-M1 that are connected to the contacts 114C, a number of metal-2 traces 114-M2, a number of metal-3 traces 114-M3, and a number of metal-4 traces 114-M4. In the present example, the metal-1 traces 114-M1, the metal-2 traces 114-M2, the metal-3 traces 114-M3, and the metal-4 traces 114-M4 are implemented with aluminum or an aluminum alloy.

In addition, metal interconnect structure 114 includes a number of inter-metal vias 114V that connect the metal-1 traces 114-M1 and the metal-2 114-M2 traces together, the metal-2 traces 114-M2 and the metal-3 114-M3 traces together, and the metal-3 traces 114-M3 and the metal-4 114-M4 traces together.

Metal interconnect structure 114 further includes an insulation region 114I that touches semiconductor substrate 110, the semiconductor devices (e.g., the conductive contacts 112), the contacts 114C, the metal-1 traces 114-M1, the metal-2 traces 114-M2, the metal-3 traces 114-M3, the metal-4 traces 114-M4, and the inter-metal vias 114V. In the present example, insulation region 114I includes a region of oxide 114L and an overlying passivation layer 114U. Passivation layer 114U, which has a top surface 114S, can be implemented with, for example, oxide, nitride, or a combination of oxide and nitride.

In addition, metal interconnect structure 114 includes a number of copper traces 114CL, including copper lines 114T and copper pads 114P, that touch the top surface of passivation layer 114U, and also extend through passivation layer 114U as necessary to make electrical connections with selected regions on the top surfaces of the aluminum metal-4 traces 114-M4. Each copper trace 114CL typically includes a copper layer 114G and an underlying seed layer 114H. Seed layer 114H typically includes a layer of titanium (e.g., 300 Å thick) and an overlying layer of copper (e.g., 3000 Å thick). The titanium layer enhances the adhesion between the underlying aluminum metal-4 traces 114-M4 and the overlying layer of copper.

Further, metal interconnect structure 114 includes a number of conductive covers 114AC that touch the top surfaces of the copper traces 114CL to provide wire bonding surfaces for the copper pads 114P. Each conductive cover 114AC typically includes an overlying layer 114Q, such as aluminum, aluminum-copper (e.g., 0.5% copper), or gold, and an underlying barrier/adhesion enhancing layer 114R, such as titanium, that provides a metal barrier and enhances the adhesion of layer 114Q to the underlying copper in the copper traces 114CL. Wire bond lines 116 can then be attached to the conductive covers 114AC that lie over the copper pads 114P. Thus, with copper-topped die 100, the conductive covers 114AC and the underlying copper lines 114T and copper pads 114P are exposed.

One well-known approach to effectively increasing the total silicon surface area of a die, and thereby increasing the number of semiconductor devices that can be formed on the die, without increasing the printed circuit board (PCB) footprint required by the die is to vertically stack one die on top of another.

Figure 2A:
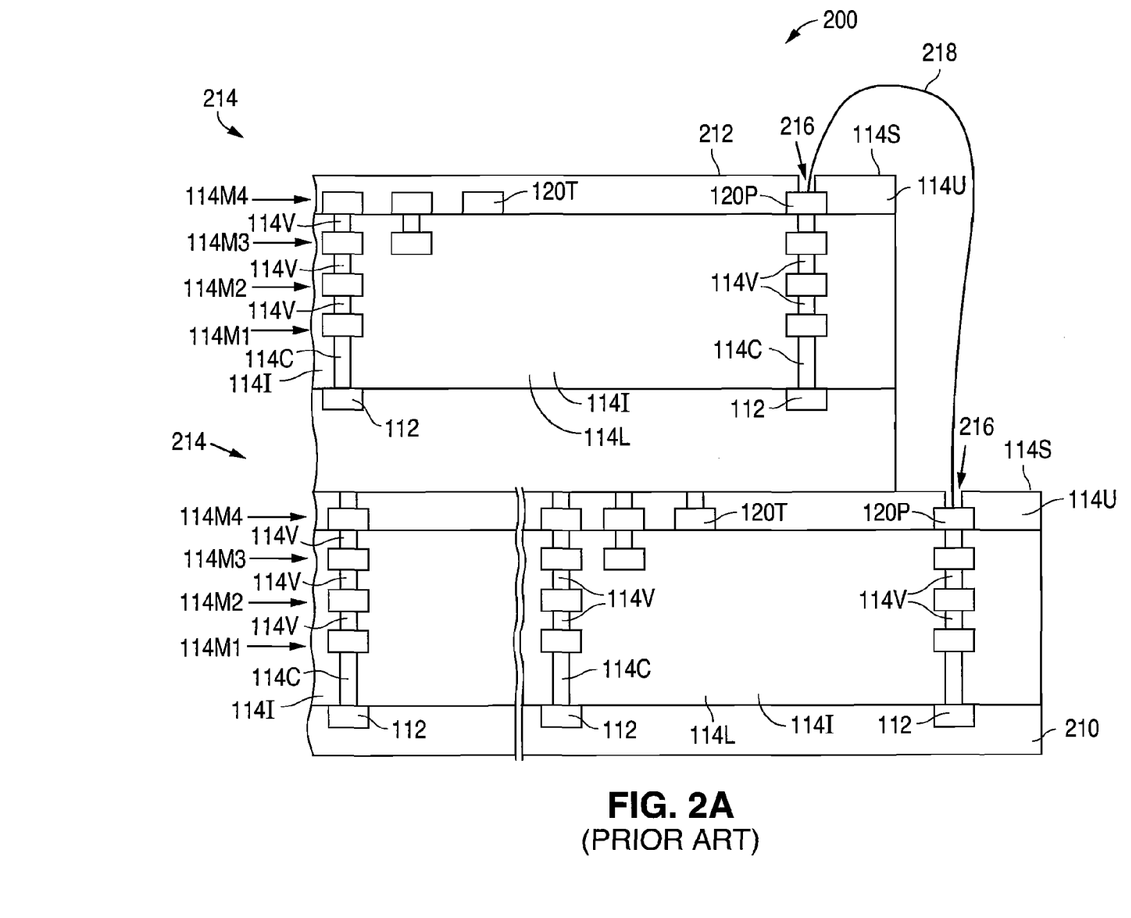
FIG. 2A is a cross-sectional view illustrating a prior-art stacked die structure 200.

FIG. 2A shows a cross-sectional view that illustrates a prior-art stacked die structure 200. As shown in FIG. 2A, stacked die structure 200 includes a lower die 210, and an upper die 212 that is attached to the top surface of lower die 210. Lower die 210 is similar to copper-topped die 100 and, as a result, utilizes the same reference numerals to designate the structures which are common to both die.

Lower die 210 differs from die 100 in that lower die 210 includes a metal interconnect structure 214 in lieu of metal interconnect structure 114. Metal interconnect structure 214 is identical to metal interconnect structure 114 except that: (1) the aluminum metal-4 traces 114-M4, which have both aluminum lines 120T and aluminum pads 120P, form the top metal layer (which provides an external electrical connection point); (2) passivation layer 114U includes a number of openings 216 that extend through passivation layer 114U to expose the aluminum pads 120P; (3) the copper traces 114CL are absent; and (4) the conductive covers 114AC are absent.

In addition, upper die 212 is similar to lower die 210. Upper die 212 differs from lower die 210 in that upper die 212 has a smaller footprint and can realize a different electrical circuit than lower die 210. As a result, upper die 212 utilizes the same reference numerals as lower die 210 to designate the structures which are common to both dice. Wire bond lines 218 can then be used to connect the aluminum pads 120P on upper die 212 to the aluminum pads 120P on lower die 210.

As a result of the structure of lower die 210, which is topped by passivation layer 114U, upper die 212 can be directly attached to the top surface of lower die 210 (by way of an adhesive such as glue) because the bottom surface of upper die 212 (which is a conductive substrate) only touches non-conductive passivation layer 114U of lower die 210.

One problem with copper-topped die 100, however, is that copper-topped die 100 can not be used as an underlying die in a stacked die structure. This is because if an upper die were directly attached to the top surface of copper-topped die 100, then the conductive covers 114AC will directly contact, and be shorted out by, the bottom surface (which is a conductive substrate) of upper die 212.

Figure 2B:
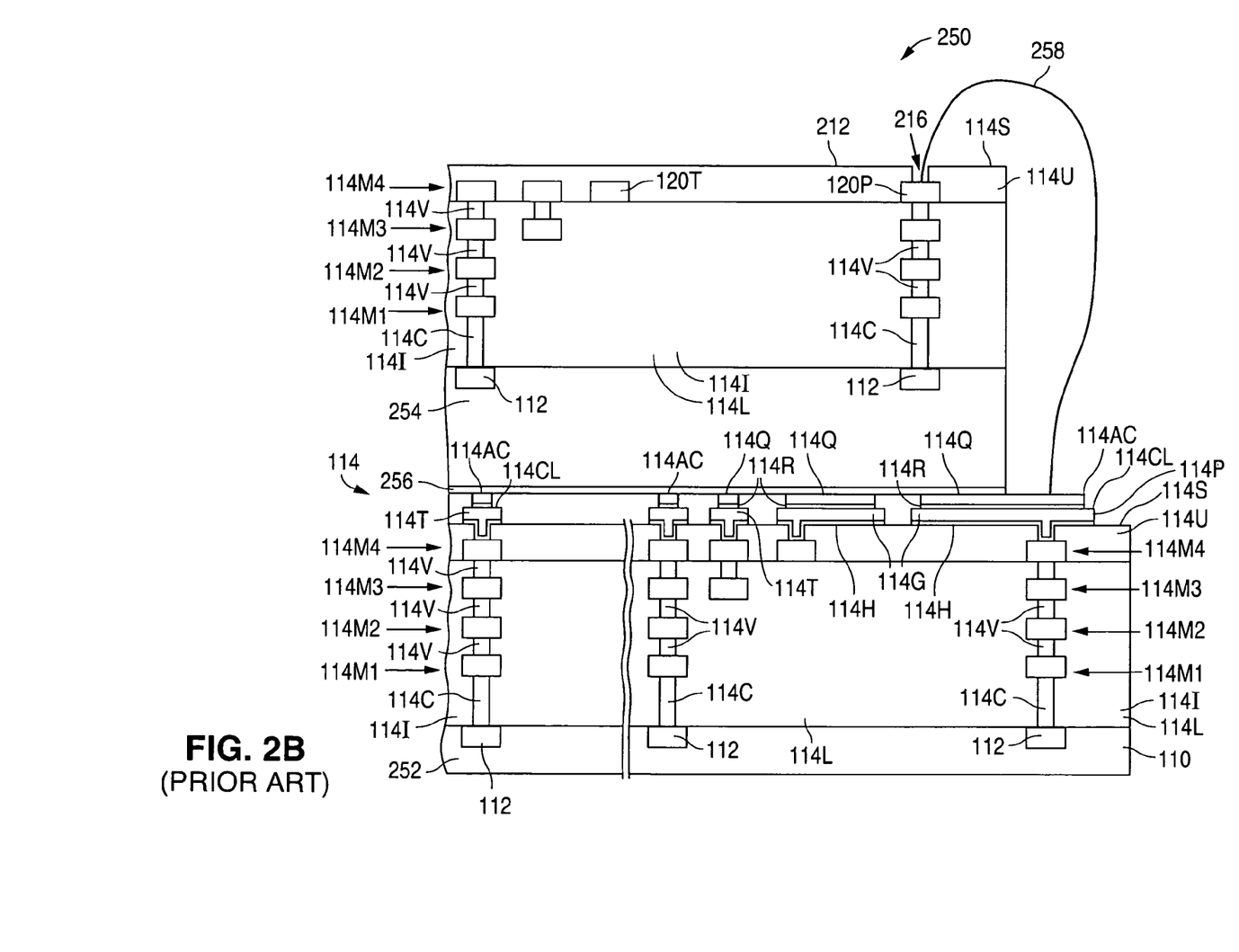
FIG. 2B is a cross-sectional view illustrating a prior-art stacked die structure 250.

One approach to this problem is to attach an insulting sheet of material to the bottom side of the upper die. FIG. 2B shows a cross-sectional view that illustrates a prior-art stacked die structure 250 that utilizes an insulating sheet of material. As shown in FIG. 2B, stacked die structure 250 includes a lower die 252 and an upper die 254. Lower die 252 is identical to copper-topped die 100 and, as a result, utilizes the same reference numerals to designate the structures which are common to both dice. Upper die 254 is identical to upper die 212 and, as a result, utilizes the same reference numerals to designate the structures which are common to both dice.

In addition, stacked die structure 250 includes an insulting sheet 256 that physically connects die 252 to die 254, and a wire bonding line 258 that electrically connects die 252 to die 254. Insulating sheet 256 is adhesively attached to the top surfaces of the conductive covers 114AC of lower die 252, and to the bottom surface of upper die 254.

Although insulating sheet 256 prevents the conductive covers 114AC of lower die 252 from being shorted out by the conductive substrate of upper die 254, insulating sheet 256 provides poor mechanical stability due to the limited number of places where insulating sheet 256 is attached to lower die 252. As a result, there is a need for a stacked die structure that can utilize a copper-topped lower die.

BRIEF DESCRIPTION OF THE DRAWINGS

FIGS. 1A-1B are views illustrating a prior-art copper-topped die 100. FIG. 1A is a plan view, while

FIGS. 3A-3B are views illustrating an example of a stacked die structure 300 in accordance with the present invention. FIG. 3A is a plan view, while

FIGS. 4A-4B are views illustrating an example of a stacked die structure 400 in accordance with the present invention. FIG. 4A is a plan view, while

FIGS. 5A-5C are views illustrating an example of a method of forming a copper-topped die structure 500 in accordance with the present invention. FIG. 5A is a cross-sectional view, while

DETAILED DESCRIPTION OF THE INVENTION

Figure 3A:
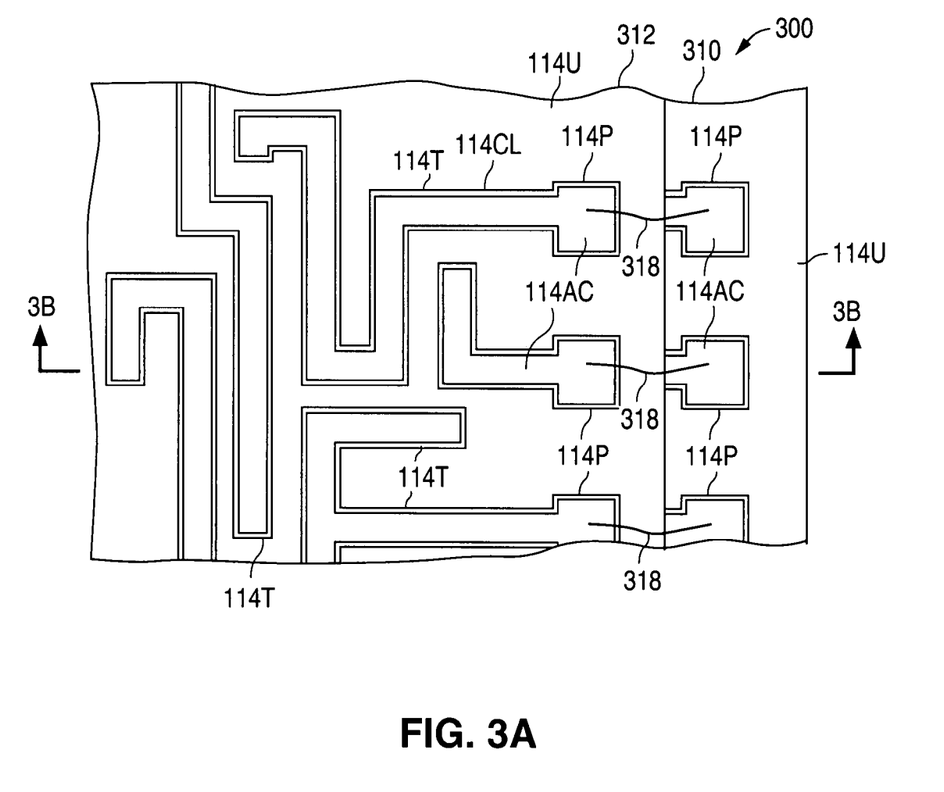
Figure 3B:
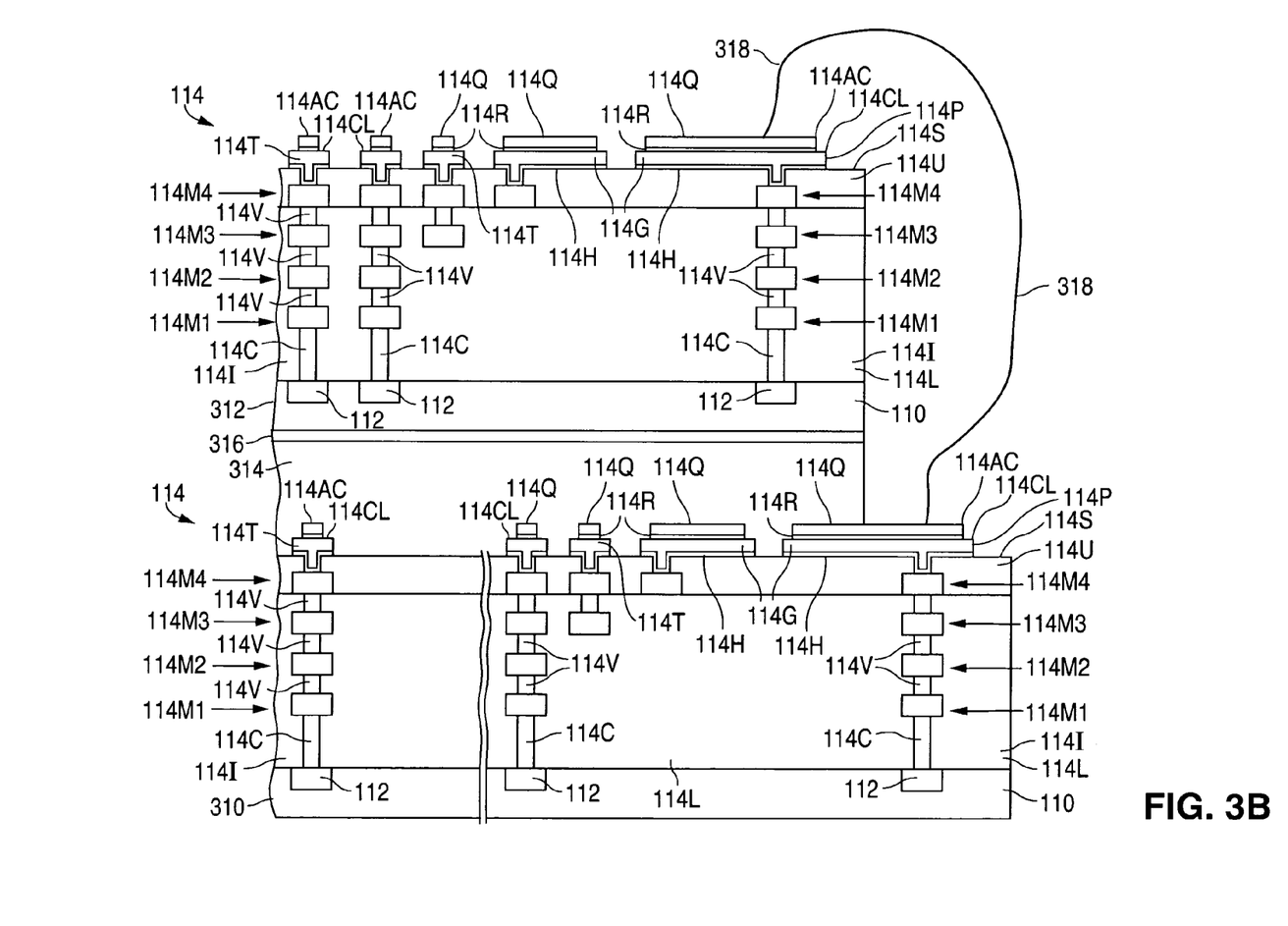
FIG. 3B is a cross-sectional view taken along line 3B-3B of FIG. 3A.

FIGS. 3A-3B show views that illustrate an example of a stacked die structure 300 in accordance with the present invention. FIG. 3A shows a plan view, while FIG. 3B shows a cross-sectional view taken along line 3B-3B of FIG. 3A. As shown in FIGS. 3A-3B, stacked die structure 300 includes a lower die 310 and an upper die 312. In the present example, lower die 310 is similar to copper-topped die 100 and, as a result, utilizes the same reference numerals as die 100.

Upper die 312, in turn, can be implemented with any wire-bonded die (such as copper-topped die 100 or upper die 212) which has a smaller footprint than lower die 310. In the present example, upper die 312 differs from lower die 310 in that upper die 312 has a smaller footprint and can realize a different electrical circuit than lower die 310. As a result, upper die 312 utilizes the same reference numerals as lower die 310 to designate the structures which are common to both dice.

As further shown in FIGS. 3A-3B, stacked die structure 300 also includes a planarized non-conductive layer 314, such as a layer of benzocyclobutene (BCB) or a polymer, that touches passivation layer 114U of lower die 310, touches and lies between the copper traces 114CL of lower die 310, and touches and covers the conductive covers 114AC of lower die 310. Non-conductive layer 314, however, does not touch or lie over the copper pads 114P of lower die 310.

In addition, stacked die structure 300 includes an adhesive layer 316 that attaches the bottom surface of upper die 312 to non-conductive layer 314. Adhesive layer 316 can be represented by, for example, glue or a layer of discontinuities that result from thermal (low temperature) wafer bonding. Stacked die structure 300 further includes a number of wire bond lines 318 that connect the conductive covers 114AC on upper die 312 to the conductive covers 114AC on lower die 310. (In this example, either lower die 310 or upper die 312 can have additional pads that are connected to the external world.)

Figure 4A:
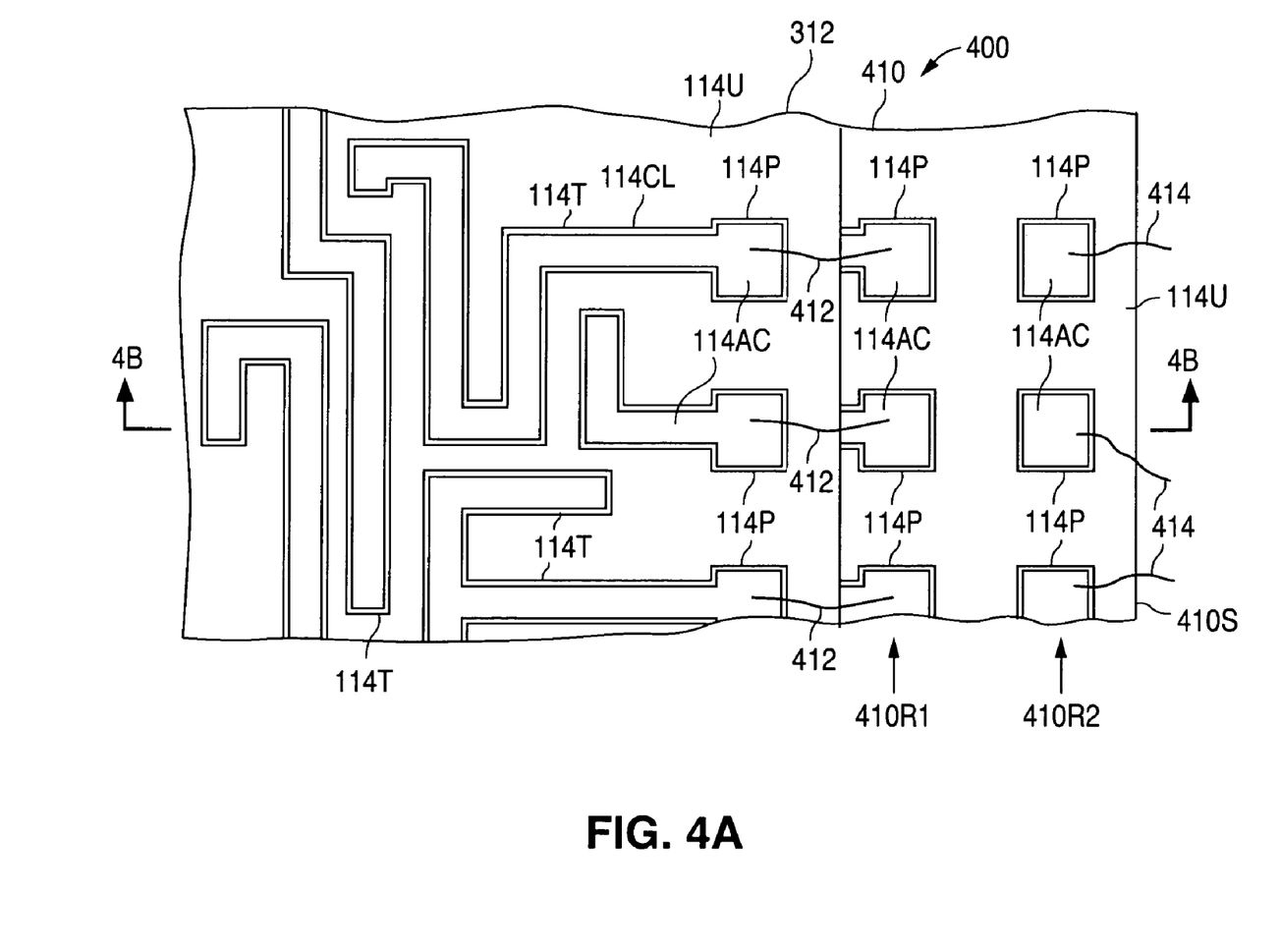
Figure 4B:
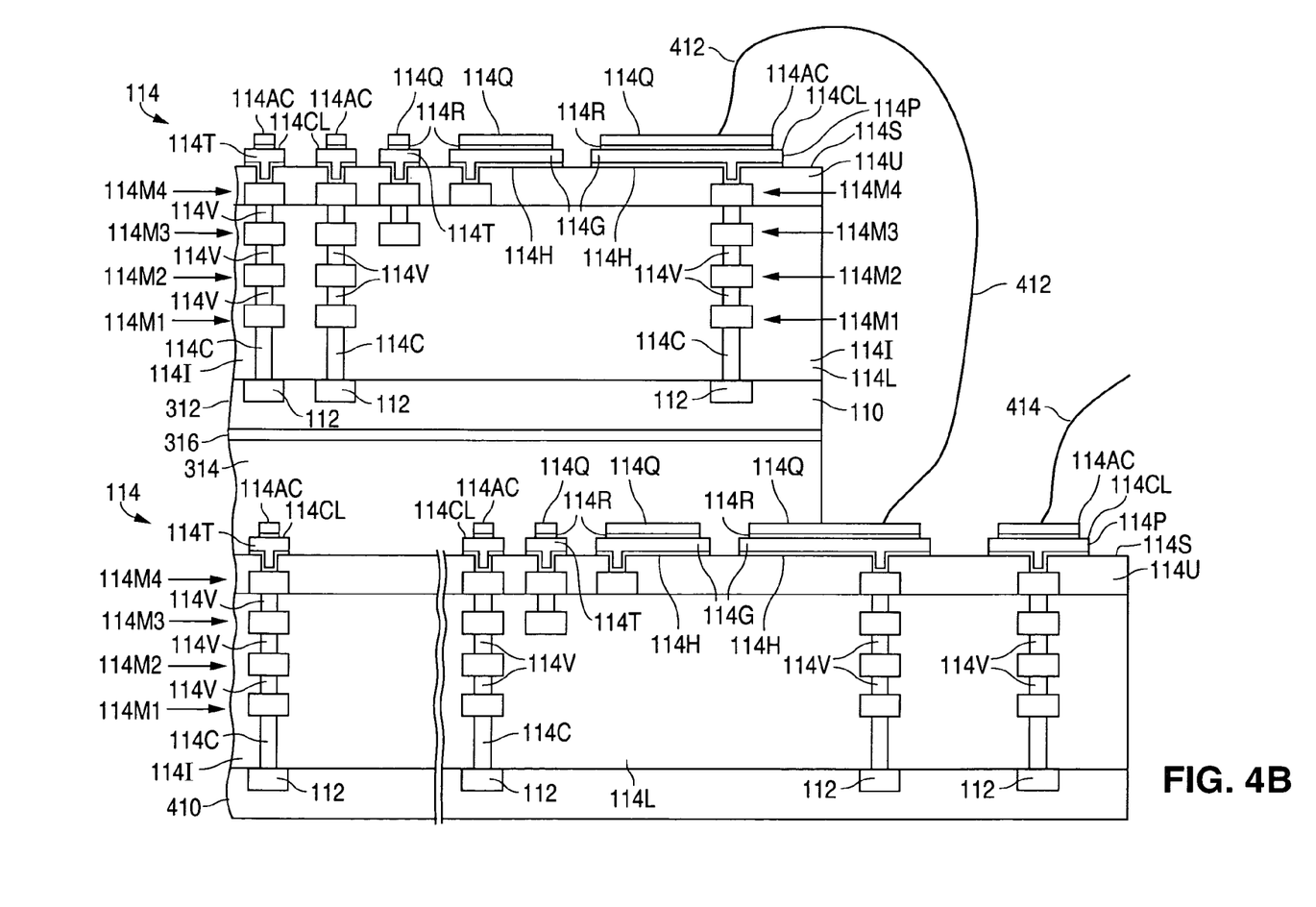
FIG. 4B is a cross-sectional view taken along line 4B-4B of FIG. 4A.

FIGS. 4A-4B show views that illustrate an example of a stacked die structure 400 in accordance with the present invention. FIG. 4A shows a plan view, while FIG. 4B shows a cross-sectional view taken along line 4B-4B of FIG. 4A. Stacked die structure 400 is similar to stacked die structure 300 and, as a result, utilizes the same reference numerals to designate the structures which are common to both structures.

As shown in FIG. 4, stacked die structure 400 differs from stacked die structure 300 in that stacked die structure 400 utilizes a lower die 410 in lieu of lower die 310. Lower die 410, in turn, is identical to lower die 310 except that lower die 410 includes two adjacent rows of copper pads 114P with overlying conductive covers 114AC. (Each row of copper pads 114P can be formed around the periphery of lower die 410, or along one or more sides of lower die 410.) The two rows of copper pads 114P include an inner row 410R1 of copper pads 114P and an outer row 410R2 of copper pads 114P. The outer row of copper pads 114P lies between the inner row 410R1 of copper pads 114P and a side 410S of lower die 410.

Stacked die structure 400 also differs from stacked die structure 300 in that a number of wire bonding lines 412 are used to electrically connect the conductive covers 114AC and underlying copper pads 114P of upper die 312 to the conductive covers 114AC and underlying copper pads 114P in the inner row of lower die 410. Further, a number of wire bonding lines 414 are used to electrically connect the conductive covers 114AC and underlying copper pads 114P in the outer row of lower die 410 to the external world.

Thus, in accordance with the present invention, a stacked die structure has been described that utilizes a copper-topped lower die. One of the advantages of the stacked die structures 300 and 400 is that non-conductive layer 314 provides greater mechanical stability. Unlike stacked die structure 250, which has poor mechanical stability due to the limited number of places where insulating sheet 256 is attached to lower die 252, non-conductive layer 314 touches the conductive covers 114AC, the copper traces 114T, and the top surfaces of lower dice 300 and 400, thereby providing substantially greater mechanical stability.

Another advantage is that non-conductive layer 314, which has a higher dielectric constant than air, lies between the conductive cover 114AC and copper trace 114T of one structure and the conductive cover 114AC and copper trace 114T of an adjacent structure. As a result, non-conductive layer 314 provides substantially greater electrical isolation between adjacent conductive covers 114AC/copper traces 114T (such as when VDD and VSS lie adjacent to each other) as well as providing a sealant against humidity and other environmental factors.

A further advantage of the stacked die structures 300 and 400 is that the stacked die structures 300 and 400 can be fabricated using conventional die stacking processes. This is because after non-conductive layer 314 has been formed, lower die 310 and lower die 410 can be treated as a conventional lower stacked die, such as lower stacked die 210.

Figure 5A:
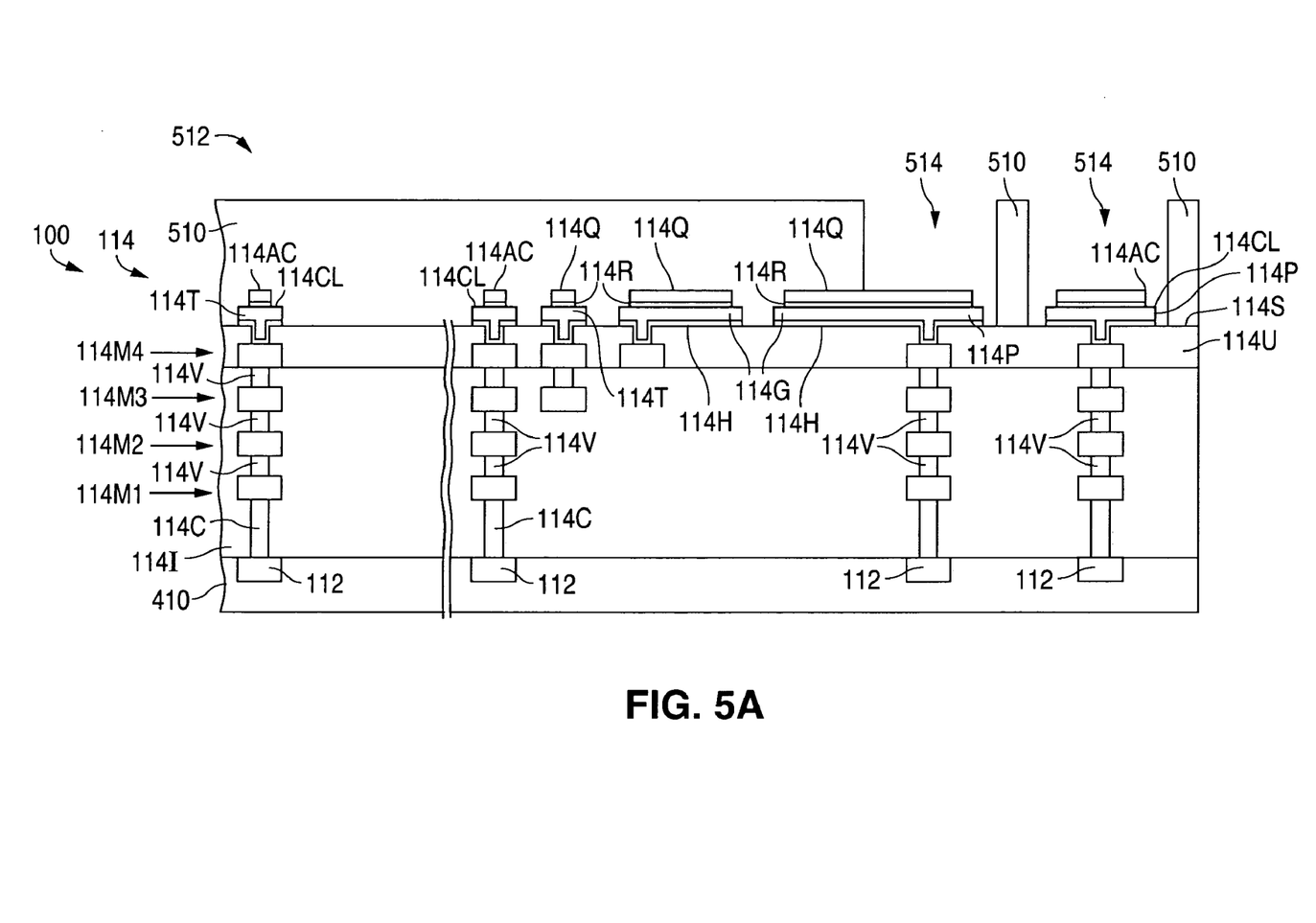
Figure 5B:
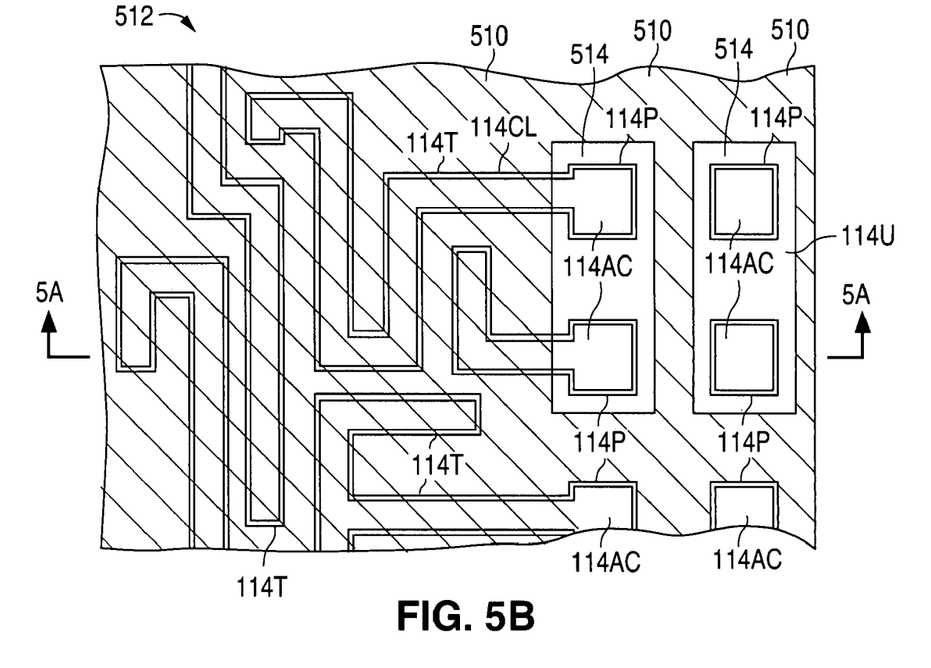
FIGS. 5B and 5C are plan views.
Figure 5C:
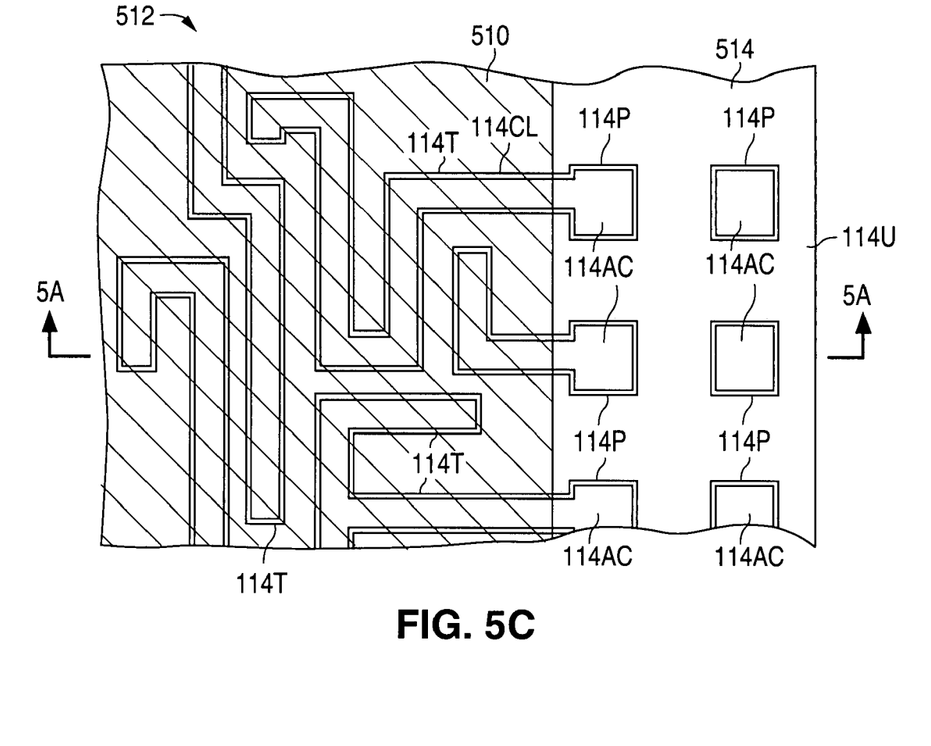

FIGS. 5A-5C show views that illustrate an example of a method of forming a copper-topped die structure 500 in accordance with the present invention. FIG. 5A shows a cross-sectional view, while FIGS. 5B and 5C show plan views. As shown in FIG. 5A, the method, which utilizes copper-topped die 100, begins by depositing a photosensitive polymer material layer, such as a layer of benzocyclobutene (BCB), which is in a liquid state, on passivation layer 114U, the copper traces 114CL, and the aluminum covers 114AC.

Following this, the photosensitive polymer material is exposed to a shadowed ultraviolet (UV) or other energetic light source. A shadowed light source is a masked light source that has transparent regions that pass light energy, and opaque regions that block light energy.

As shown in FIG. 5A, the light energy hardens all of the photosensitive polymer material to form a hardened layer 510, except for the regions that lie over the conductive covers 114AC and the underlying copper pads 114P. These regions are blocked from receiving light energy, and therefore remain unexposed. After exposure, the unexposed regions of the photosensitive material (which did not receive any light energy and were not hardened) are then rinsed away to form a lower die 512 with one or more openings 514 that extends through hardened layer 510.

As shown in FIG. 5B, the openings 514 can form a number of windows of any desired size to expose any number of the aluminum covers 114AC/copper pads 114P. Alternately, as shown in FIG. 5C, a single opening 514 can expose multiple rows of the aluminum covers 114AC/copper pads 114P. (FIG. 5A is taken along the cut-plane 5A-5A shown in the plan views of FIGS. 5B and 5C.)

Thus, the openings 514 provide significant design flexibility by allowing the aluminum covers 114AC/copper pads 114P to be exposed and isolated from each other in many different ways. This also provides greater flexibility in the placement of an overlying die, i.e., the overlying die can be placed anywhere as long as it does not cover an opening 514. Further, lithography problems are eliminated because the openings 514 can be formed with large critical dimensions.

Following the formation of the one or more openings 514, an adhesive is applied to the bottom surface of an upper die. The upper die is then attached to lower die 512 to form a stacked die structure, such as stacked die structure 400.

It should be understood that the above descriptions are examples of the present invention, and that various alternatives of the invention described herein may be employed in practicing the invention. For example, although stacked die structures 300 and 400 show that the footprint of non-conductive layer 314 is the same as upper die 312, non-conductive layer 314 can have a larger footprint than upper die 312 to simplify the attachment of upper die 312 to lower die 310 or 410. Thus, it is intended that the following claims define the scope of the invention and that structures and methods within the scope of these claims and their equivalents be covered thereby.

What is claimed is:

1. A stacked die structure comprising:
    a lower die having:
        a semiconductor material;
        a number of contact regions formed in the semiconductor material; and
        a metal interconnect structure that touches the semiconductor material and the contact regions to define an electrical circuit, the metal interconnect structure having a non-conductive region, a number of copper lines, and a number of copper pads, the non-conductive region having a top surface, the copper pads and copper lines touching the top surface of the non-conductive region, the number of copper lines having a number of top surfaces, the number of copper lines and the number of copper pads having top surfaces that lie substantially in a common horizontal plane;
    a non-conductive layer that touches the top surface of the non-conductive region and the top surfaces of the copper lines, the non-conductive layer lying laterally between and touching adjacent copper lines, no portion of the non-conductive layer lying over a copper pad of the number of copper pads; and
    an upper die attached to the non-conductive layer.

2. The stacked die structure of claim 1 wherein the upper die includes a pad.

3. The stacked die structure of claim 2 wherein the pad of the upper die includes aluminum.

4. The stacked die structure of claim 2 wherein the pad of the upper die includes an upper region that touches and lies over a lower region, the upper region including aluminum, the lower region including copper and no aluminum.

5. The stacked die structure of claim 2 and further comprising a wire bonding line that touches the pad of the upper die, the wire bonding line being electrically connected to a copper pad of the metal interconnect structure.

6. The stacked die structure of claim 2 wherein the number of copper pads of the lower die includes an inner row of copper pads and an outer row of copper pads that lie between the inner row of copper pads and a side of the lower die.

7. The stacked die structure of claim 6 and further comprising a wire bonding line that touches the pad of the upper die, the wire bonding line being electrically connected to a copper pad in the inner row of copper pads of the metal interconnect structure.

8. The stacked die structure of claim 1 wherein the upper die is attached to the non-conductive layer by way of an adhesive.

9. The stacked die structure of claim 1 wherein the upper die is attached to the non-conductive layer by way of wafer bonding.

10. The stacked die structure of claim 1 wherein the non-conductive layer touches all of the top surfaces of the copper lines.

11. A stacked die structure comprising:
    a lower die having:
        a semiconductor material;
        a number of contact regions formed in the semiconductor material; and
        a metal interconnect structure that touches the semiconductor material and the contact regions to define an electrical circuit, the metal interconnect structure having a non-conductive region, a number of copper lines, and a number of copper pads, the non-conductive region having a top surface, the copper pads and copper lines touching the top surface of the non-conductive region, the number of copper lines having a number of top surfaces, the number of copper lines and the number of copper pads having top surfaces that lie substantially in a common horizontal plane;

a non-conductive layer that touches the top surface of the non-conductive region and the top surfaces of the copper lines, the non-conductive layer lying laterally between and touching adjacent copper lines; and an upper die attached to the non-conductive layer.

12. The stacked die structure of claim 11 wherein the upper die includes a substrate that is attached to the non-conductive layer.

13. The stacked die structure of claim 11 wherein the non-conductive layer touches all of the top surfaces of the copper lines.

14. The stacked die structure of claim 11 wherein the upper die includes a pad.

15. The stacked die structure of claim 14 wherein the pad of the upper die includes aluminum.

16. The stacked die structure of claim 14 wherein the pad of the upper die includes an upper region that touches and lies over a lower region, the upper region including aluminum, the lower region including copper and no aluminum.

17. The stacked die structure of claim 14 and further comprising a wire bonding line that touches the pad of the upper die, the wire bonding line being electrically connected to a copper pad of the metal interconnect structure.

18. The stacked die structure of claim 14 wherein the number of copper pads of the lower die includes an inner row of copper pads and an outer row of copper pads that lie between the inner row of copper pads and a side of the lower die.

19. The stacked die structure of claim 18 and further comprising a wire bonding line that touches the pad of the upper die, the wire bonding line being electrically connected to a copper pad in the inner row of copper pads of the metal interconnect structure.

\* \* \* \* \*